United States Patent [19]
Nushiyama et al.

[11] Patent Number: 5,628,107
[45] Date of Patent: May 13, 1997

[54] ELECTRONIC PARTS-MOUNTING APPARATUS

[75] Inventors: Shuji Nushiyama; Yoshinori Kano; Shigeru Kageyama, all of Gunma-ken, Japan

[73] Assignee: Sanyo Electric Co., Ltd., Osaka-fu, Japan

[21] Appl. No.: 586,601

[22] Filed: Jan. 16, 1996

[30] Foreign Application Priority Data

Jan. 17, 1995 [JP] Japan .................... 7-004808

[51] Int. Cl.$^6$ .................... H05K 3/30; H05K 13/04
[52] U.S. Cl. .................... 29/740; 29/741; 29/743; 294/64.1; 414/225
[58] Field of Search ............... 29/739, 740, 741, 29/743, 759, 832, 834, DIG. 44; 294/2, 64.1; 414/225, 737, 752

[56] References Cited

U.S. PATENT DOCUMENTS

| | | | |
|---|---|---|---|
| 4,794,689 | 1/1989 | Seno et al. | 29/834 X |
| 4,815,913 | 3/1989 | Hata et al. | 414/225 |
| 5,033,185 | 7/1991 | Hidese | 29/740 |
| 5,195,235 | 3/1993 | Mifuji | 29/740 X |
| 5,208,975 | 5/1993 | Hidese | 29/743 X |
| 5,498,942 | 3/1996 | Ijuin | 29/739 X |

FOREIGN PATENT DOCUMENTS

| | | | |
|---|---|---|---|
| 111036 | 7/1982 | Japan | 29/740 |
| 148599 | 5/1992 | Japan | 29/743 |
| 345097 | 12/1992 | Japan | 29/743 |
| 345098 | 12/1992 | Japan | 29/743 |

*Primary Examiner*—Peter Vo
*Attorney, Agent, or Firm*—Darby & Darby

[57] ABSTRACT

An electronic parts-mounting apparatus includes an index unit which has an output shaft and is connected to a reduction gear for being driven thereby. A rotatable table is connected to the index unit and driven thereby into intermittent rotation. At least one camshaft is connected to the output shaft of the index unit. At least one cam rigidly mounted on the at least one camshaft is in contact with at least one cam follower associated therewith. The output shaft of the index unit is caused to rotate at a uniform rotational speed in which one rotation thereof corresponds to a plurality of repetition periods of intermittent rotation of the rotatable table. The at least one cam has a cam profile formed such that one rotation of the at least one cam causes a plurality of repetition periods of operation of the at least one cam follower in contact therewith, and at the same time each of the plurality of repetition periods of the operation of the at least one cam follower is identical to each of the plurality of repetition periods of the intermittent rotation of the rotatable table.

5 Claims, 5 Drawing Sheets

ELECTRONIC PARTS-MOUNTING APPARATUS

BACKGROUND OF THE INVENTION

1. Field of the Invention

This invention relates to an electronic parts-mounting apparatus including a rotatable table which carries mounting heads and intermittently rotates while enabling each mounting head to pick up an electronic part by sucking, carry the sucked electronic part, and mount the same on a circuit board, and lifting/lowering devices provided for the mounting heads for lifting and lowering the mounting heads to thereby enable each mounting head to suck or mount the electronic part during stoppage of the rotatable table, and more particularly to an improvement of a drive system of the apparatus.

2. Prior Art

Conventionally, an electronic parts-mounting apparatus of this kind includes an index unit which has its input side connected to a drive motor as a driving force source via a worm reduction gear, and its output side connected to a rotatable table carrying mounting heads, and an output shaft connected to two or three camshafts for transmitting the driving force or torque to various devices each provided for operation in synchronism with the intermittent rotation of the rotatable table. The uniform rotation of the drive motor is reduced in speed by the worm reduction gear and the resulting rotational motion is input to the index unit. The index unit, on one hand, converts the uniform rotation into intermittent rotation (index rotation) to cause the rotatable table to rotate intermittently, and on the other hand, transmits the uniform rotation (or torque) via the output shaft and a timing belt to the two or three camshafts to cause the same to rotate at the uniform rotational speed. As the rotatable table intermittently rotates, the mounting heads carried thereby rotate and stop at a sucking position, a mounting position, a correcting position, and other predetermined positions. On the other hand, as the camshafts rotate at the uniform rotational speed, various cams mounted thereon operate to lower and lift the mounting heads for sucking or mounting of electronic parts, selection of a sucking nozzle of each mounting head, and other operations, in a manner synchronous with stoppage of the rotatable table.

More specifically, the index unit causes two repetition periods of intermittent rotation (one repetition period consisting of a period of one intermittent rotational motion and a period of stoppage) of the rotatable table and at the same time one complete rotation of the output shaft at the uniform speed, per complete uniform rotation input to the index unit via the worm reduction gear. To this end, in the conventional electronic parts-mounting apparatus, a pulley mounted on the output shaft has a radius twice as large as the radius of a pulley mounted on each camshaft, whereby the camshaft is rotated at a rotational speed twice as high as the rotational speed of the output shaft to make the repetition period (intermittent period) of intermittent rotation of the rotatable table synchronous with the repetition period (operating period) of operation of the cam follower which is in rolling contact with the cam. That is, when the rotatable table is in stoppage, the lifting/lowering devices and other devices provided for the mounting heads and linked to the cam followers are each driven for performing one complete operation. Thus, the rotational speed of the rotatable table is made twice as high as that of the rotation input by the worm reduction gear, and at the same time the rotational speed of the camshafts is made twice as high as the same. This provides a measure or means for increasing the speed of the overall operation of the electronic parts-mounting apparatus using the worm reduction gear which sets a limit to the allowable input rotational speed, i.e. a measure or means for increasing the speed of mounting of electronic parts.

As described above, to make the intermittent period of the rotatable table synchronous with the operating period of the cam followers in rolling contact with the cams which are mounted on the camshafts and associated with the cam followers, respectively, the rotational speed of the camshafts is made twice as high as the rotational speed of the output shaft by means of pulleys mounted on the output shaft and the camshafts. Accordingly, the rotational speed of the cams is doubled, which causes wear of the cams and markedly increases thrusting forces applied to the cam followers, resulting in shortened lives of the cam followers and bearings of the camshafts.

SUMMARY OF THE INVENTION

It is the object of the invention to provide an electronic parts-mounting apparatus which is capable of making the repetition period of intermittent rotation of a rotatable table and the repetition period of operations of cams linked thereto synchronous with each other without increasing the rotational speed of the cams.

To attain the above object, the present invention provides an electronic parts-mounting apparatus including an index unit which has an output shaft and is connected to a reduction gear for being driven thereby, a rotatable table connected to the index unit for intermittent rotation, at least one camshaft connected to the output shaft of the index unit for uniform rotation, at least one cam rigidly mounted on the at least one camshaft, and at least one cam follower in contact with the at least one cam associated therewith, the output shaft of the index unit being caused to rotate at a uniform rotational speed in which one rotation thereof corresponds to a plurality of repetition periods of intermittent rotation of the rotatable table.

The electronic parts-mounting apparatus of the present invention is characterized in that the at least one cam has a cam profile formed such that one rotation of the at least one cam causes a plurality of repetition periods of operation of the at least one cam follower in contact therewith, and at the same time each of the plurality of repetition periods of the operation of the at least one cam follower is identical to each of the plurality of repetition periods of the intermittent rotation of the rotatable table.

According to the electronic parts-mounting apparatus of the invention, while the output shaft of the index unit is caused to rotate at the uniform rotational speed in which one rotation thereof corresponds to a plurality of repetition periods of intermittent rotation of the rotatable table, the cam profile of the at least one cam is formed such that one rotation of the at least one cam causes a plurality of repetition periods of operation of the at least one cam follower in contact therewith, and at the same time each of the plurality of repetition periods of the operation of the at least one cam follower is identical to each of the plurality of repetition periods of the intermittent rotation of the rotatable table. Therefore, the repetition period of the intermittent rotation of the rotatable table is made completely identical to the repetition period of the operation of the cam follower, whereby it is made possible to make the intermittent rotational motion of the rotatable table synchronous with the operation of the cam follower and devices connected thereto on the outside side, without increasing the rotational speed of the cam to the increased speed of intermittent rotation of the rotatable table.

Preferably, the output shaft and the at least one camshaft are connected to each other such that the output shaft and the at least one camshaft rotate at the same rotational speed.

Preferably, the output shaft and the at least one camshaft are connected by a output shaft pulley rigidly mounted on the output shaft, at least one camshaft pulley rigidly mounted on the at least one camshaft, a timing belt carried by the output shaft pulley and the at least one camshaft pulley, the output shaft pulley and the at least one camshaft pulley having an identical diameter.

For example, the output shaft of the index unit rotates at the uniform rotational speed in which one rotation thereof corresponds to two repetition periods of the intermittent rotation of the rotatable table.

The above and other objects, features, and advantages of the invention will become more apparent from the following detailed description taken in conjunction with the accompanying drawings.

DETAILED DESCRIPTION

The invention will now be described in detail with reference to drawings showing an embodiment thereof.

Figure 1:
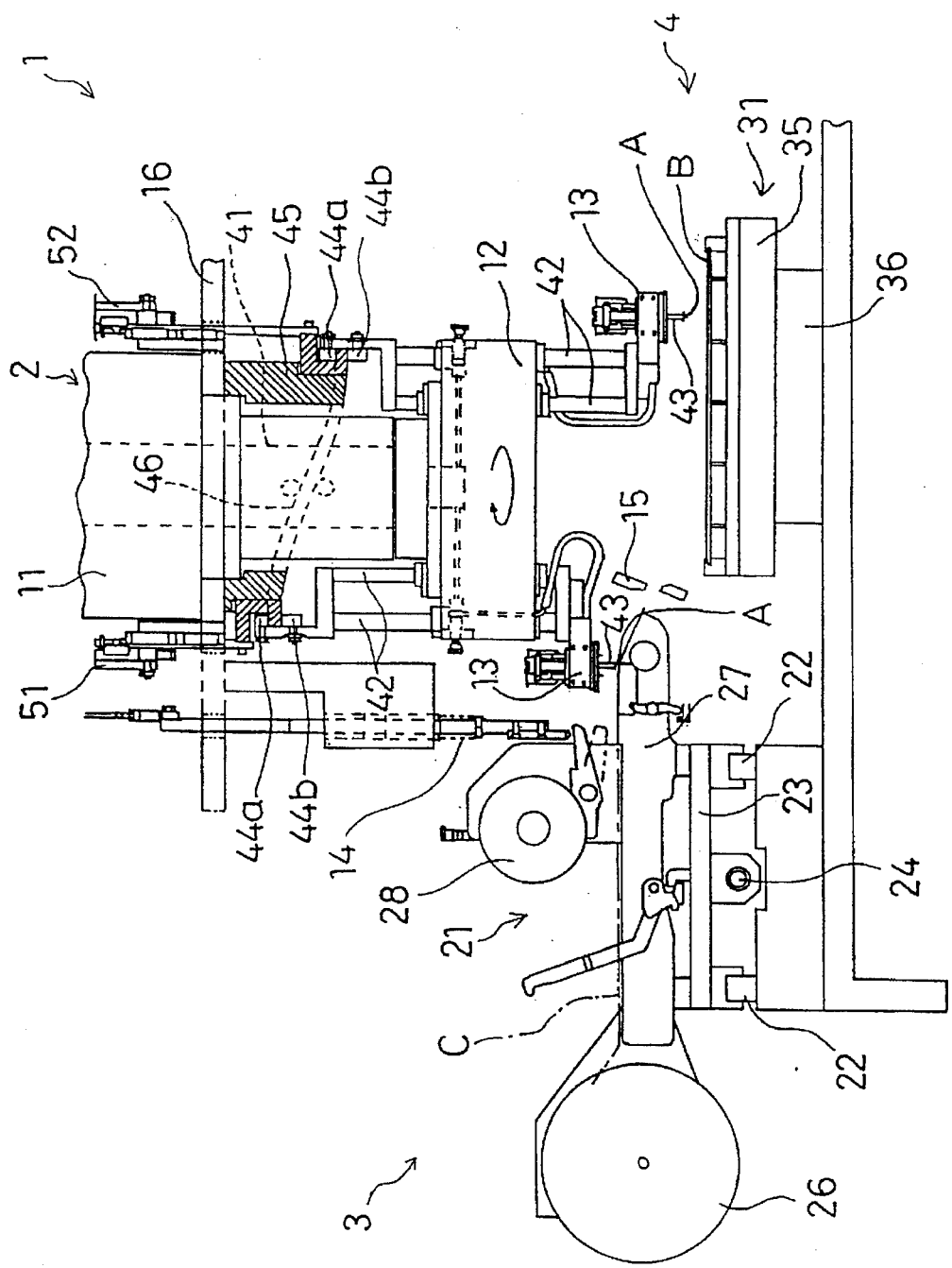
FIG. 1 is a front elevation of an electronic parts-mounting apparatus according to one embodiment of the invention.
Figure 2:
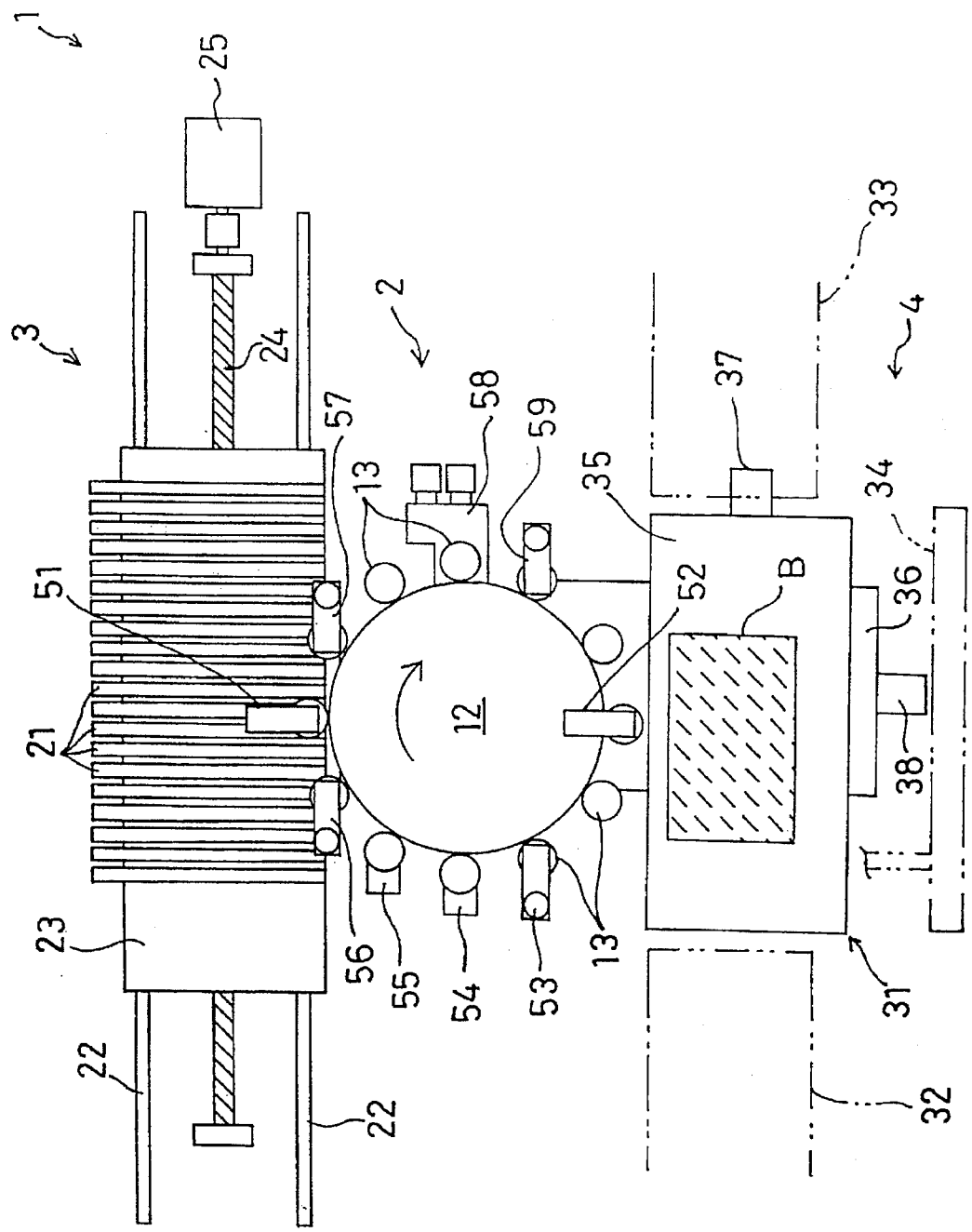
FIG. 2 is a plan view of the electronic parts-mounting apparatus.

Referring first to FIGS. 1 and 2, there is shown an electronic parts-mounting apparatus 1 according to the embodiment of the invention, which includes a main unit 2, a feeding section 3 for feeding electronic parts A, and a mounting section 4 for mounting the electronic parts A on a circuit board B, with the feeding section 3 and the mounting section 4 being arranged on opposite sides of the main unit 2. The main unit 2 is comprised of an index unit 11 forming a main part of the driving system of the apparatus, a rotatable table 12 connected thereto, and a plurality of (twelve) mounting heads 13 arranged on the outer periphery of the rotatable table 12. The rotatable 12 is intermittently rotated in angular increments corresponding to the number of the mounting heads 13. With intermittent rotation of the rotatable table 12, the mounting heads 13 are each brought into a sucking position in which the mounting head 13 faces the feeding section 3 and a mounting position in which the mounting head 13 faces the mounting section 4, in a predetermined sequence, whereby each mounting head 13 sucks an electronic part A supplied from the feeding section 3, carries the same to the mounting section 4 through rotation of the rotatable table 12, and enables the same to be mounted on the circuit board B introduced into the mounting section 4.

The feeding section 3 has parts feeders 21 corresponding in number to the number of kinds of electronic parts A to be mounted on the circuit board B. The parts feeders 21 are removably mounted in parallel with each other on a feed table 23 which is slidably guided by a pair of guide rails 22, 22. A ball screw 24 extends through the feed table 23 in the direction of sliding thereof, whereby the feed table 23 is moved forward and backward by normal and reverse rotations of a feed motor 25 connected to one end of the ball screw 24, to selectively bring a selected one of the parts feeders 21 to a position in which the selected parts feeder 21 faces the mounting head 13 in the sucking position. Each parts feeder 21 is comprised of a tape reel 26 around which a carrier tape C is wound, a tape feeder 27 which unwinds the carrier tape C off the tape reel 26, and a cover tape reel 28 which rolls a cover tape off the carrier tape C.

The electronic parts A are arranged or loaded in the carrier tape C which is formed of a support tape for carrying the electronic parts A thereon and the above-mentioned cover tape at predetermined space intervals. Each electronic part A is sucked by the mounting head 13 after part of the cover tape covering the electronic part A is peeled off. The tape feeder 27 and the cover tape reel 28 are driven by a tape feeder-driving device 14 arranged on the main unit 2 in synchronism with the operation of the rotatable table 12. Before sucking of the electronic parts A, the carrier tape C is intermittently fed and at the same time the cover tape is intermittently rolled in. The carrier tape C unwound from the tape reel 26 by the tape feeder 17 is intermittently fed at a rate corresponding to each of the space intervals of the loaded electronic parts A, while the cover tape is peeled off from the support tape immediately before it comes to a position in which the electronic part arranged on the support tape faces the mounting head 13 in the sucking position. When the electronic part A reaches the position, it is sucked by the mounting head 13 which has been lowered to its sucking point. The cover tape peeled off the support tape is rolled round the cover tape reel 28, and the support tape from which the electronic part A has been sucked is cut into pieces having a length corresponding to each space interval of the loaded electronic parts A by a tape-cutting device 15 arranged on the main unit 2.

The mounting section 4 is comprised of an X-Y table 31 for moving the circuit board B placed thereon in the directions of an X axis and a Y axis, a feed conveyor 32 and a delivery conveyor 33 arranged on both ends of the X-Y table 31, and a circuit board transfer device 34 for transferring a circuit board B on the feed conveyor 32 onto the X-Y table 31 and at the same time transferring a circuit board B already placed on the X-Y table onto the delivery conveyor 33. The X-Y table 31 is comprised of a Y-axis table 35 for supporting the circuit board B immediately thereon and an X axis table 36 supporting the Y-axis table 35. The Y-axis table 35 is moved forward or backward by a Y-axis motor 37 by way of a screw mechanism, and similarly the X-axis table 36 is moved forward or backward by an X-axis motor 38 by way of a screw mechanism. The X-axis motor 38 and the Y-axis motor 37 are controlled by a control system, not shown, for normal or reverse rotation thereof, whereby the circuit board B is moved in the directions of the X-axis and the Y-axis as desired such that a portion of the circuit board B at which the electronic part A is to be mounted is brought to a position in which the portion faces the mounting head 13 in the mounting position.

A circuit board B sent to a downstream end of the feed conveyor 32 is transferred by the circuit board transfer device 34 onto the X-Y table 31, and at the same time, a circuit board B having the electronic parts A mounted thereon is transferred by the circuit board transfer device 34 onto the delivery conveyor 33. The circuit board B placed on the X-Y table 31 is moved to its predetermined positions by the X-Y table 31, whereby portions thereof are sequentially brought to the position or point in which each of them faces the corresponding one of the mounting heads 13 in the mounting position, which carry the electronic parts thereto one after another, to have the electronic parts A mounted at the portions, respectively. The circuit board B having the electronic parts A mounted thereon as described above is transferred from the X-Y table 31 onto the delivery conveyor 33 by the circuit board transfer device 34. At the same time, a new circuit board B is introduced from the feed conveyor 32 onto the X-Y table 31.

The index unit 11 of the main unit 2, which forms the main part of the whole driving system of the apparatus, is supported by a support table 16, and converts part of a driving force input in the form of the uniform rotation of the worm reduction gear into a driving force for intermittent rotation of the rotatable table 12, and at the same time transmits the rest of the input driving force via an output shaft 64 thereof (see FIG. 3) to the tape feeder-driving device 14 and the tape-cutting device 15, as well as mounting head-lifting/lowering devices 51, 52, a nozzle selector 53, referred to hereinafter, etc. to thereby cause these devices to operate in synchronism with the repetition period of intermittent rotation of the rotatable table 12.

The rotatable table 12 is rigidly mounted on a vertical shaft 41 extending perpendicularly downward from the index unit 11 and is driven for clockwise intermittent rotation as viewed from top. The twelve mounting heads 13 are each arranged at circumferentially spaced intervals along the periphery of the rotatable table 12 by way of a pair of rods 42, 42 such that they can be moved upward and downward. In the present embodiment, the rotatable table 12 performs twelve intermittent rotations or index motions to make one complete rotational turn according to the number of mouthing heads 13. The mounting heads 13, which move around the rotational axis of the rotatable table 12, are sequentially brought to twelve stop positions in a sharing manner for each to occupy one of them by turns.

Each mounting head 13 is equipped with a plurality of (six, in the present embodiment) sucking nozzles 43 which are arranged at circumferentially spaced intervals such that a selected one can be projected out and retracted and as a whole can be moved around the vertical axis thereof. There are used six sucking nozzles 43 of six kinds to permit selection of a suitable one according to the size or the like of an electronic part A. This selection of a sucking nozzle 43 is made effective by moving the selected sucking nozzle 43 around the rotational axis of the mounting head 13 to a nozzle-setting position and causing the same to project out.

The above-mentioned two rods 42, 42 for each mounting head 13 extend upward through the rotatable table 12, and a pair of upper and lower cam followers 44a, 44b mounted at one end thereof engage with a cylindrical rib cam 46 formed around a hollow cylinder 45 fixed to the bottom of the support table 16. With intermittent rotation of the rotatable table 12, the mounting head 13 and the rods 42 rotate, which causes the cam followers 44a, 44b to roll on the cylindrical rib cam 46, whereby the mounting head 13 is lifted and lowered according to the cam profile of the cylindrical rib cam 46. More specifically, the mounting point for the mounting head 13 in the mounting position is lower than the sucking point for the same in the sucking position, so that the mounting head 13 is slowly or gradually lifted as it moves toward the sucking position, while it is slowly or gradually lowered as it moves toward the mounting position.

On the other hand, various devices are mounted on the support table 16 to be incorporated into the apparatus for accessing the mounting heads 13 in the twelve stop positions, such as the sucking position and the mounting position, which they occupy during each stoppage period of the intermittent rotation of the rotatable table 12.

At a location corresponding to the sucking position of the mounting head 13, the mounting head-lifting/lowering device 51 is arranged such that it engages with the cam followers 44a, 44b mounted on the rods 42, 42 for disconnecting the cam followers 44a, 44b from the cylindrical rib cam 46 to lower the mounting head 13 to the sucking point at which the mounting head 13 sucks the electronic part A, and at a location corresponding to the mounting position of the mounting head 13, the mounting head-lifting/lowering device 52 is arranged similarly for lowering the mounting head 13 to the mounting point at which the electronic part A sucked thereby is mounted on the circuit board B. The mounting head-lifting/lowering devices 51, 52 are identical in the basic construction except for their different arm lengths.

Further, at a location corresponding to the clockwise second next stop position from the mounting position of the mounting head 13, the aforementioned nozzle selector 53 is provided which moves the sucking nozzles 43 round to thereby bring a selected one to the nozzle-setting position at an outer location. At a location corresponding to the following stop position of the mounting head 13, a nozzle projector/retractor 54 is provided for lowering the mounting head 13 until it abuts on an abutment plate to thereby cause the unselected sucking nozzles 43 to retract, and lifting the mounting head 13 to cause the selected sucking nozzle 43 to project out. At a location corresponding to the following stop position of the mounting head 13, a nozzle length-adjusting device 55 is provided which adjusts the length of projected part of the sucking nozzle 43 according to the thickness or the like of the electronic part A.

Similarly, at a location corresponding to the following stop position which immediately precedes the sucking position, a nozzle position-correcting device 56 is provided which moves the sucking nozzle 43 round to thereby correct the position of the sucking nozzle 43, which is to be brought to the sucking point, in a transverse direction, i.e. in the direction perpendicular to the direction of forward/backward movement of the feed table 23. At a location corresponding to the stop position following the sucking position of the mounting head 13, a nozzle-returning device 57 is provided which moves the sucking nozzle round to the original nozzle-setting position. At a location corresponding to the second next location from this, a part-recognizing device 58 is provided which recognizes the attitude (on a horizontal plane) of the sucked electronic part A based on a sensed image thereof, and at a location corresponding to the following stop position, a part angle-correcting device 59 is arranged which moves the sucking nozzle 43 round based on results of recognition of the electronic part A by the part-recognizing device 58, to correct the attitude of the sucked electronic part A such that it is suitable for mounting of the same. Further, the output shaft 64 of the index unit 11 are connected to a plurality of camshafts, and the devices described above are operated in synchronism with the repetition period of intermittent rotation of the rotatable table 12 by means of respective cams mounted on the camshafts and linked with the devices.

Now, a sequence of the whole operation of the main unit 2 will be briefly described by way of illustration with reference to one of the mounting heads 13. After the mounting head 13 has mounted an electronic part A on the circuit board B when the mounting head 13 is in the mounting position, the mounting head 13 is moved round toward the sucking position by intermittent rotation of the rotatable table 12. Before the mounting head 13 reaches the sucking position, the selection, projection/retraction, adjustment of the projected part, and correction of the position, of the sucking nozzle 43 are sequentially effected for the mounting head 13 in response to control commands. On the other hand, in the sucking section 3, as the mounting head 13 is moved from the position immediately preceding the sucking position to the sucking position, the feed table 23 is moved forward and backward to bring a selected one of the parts feeders 21 to a position corresponding to the sucking position of the mounting head 13 in response to control commands.

The mounting head 13 sucks an electronic part A when it is in the sucking position, and now is moved round toward the mounting position. Before the mounting head 13 reaches the mounting position, returning of the sucking nozzle 43 to the nozzle-setting position, recognition of the sucked electronic part A, and correction of angle of the electronic part A based on results of the recognition are sequentially effected for the mounting head 13. On the other hand, in the mounting section, the X-Y table 31 is moved in response to control commands as the mounting head 13 is moved from the stop position immediately preceding the mounting position to the mounting position, thereby bringing a portion of the circuit board B at which the electronic part A is to be mounted to the position in which the portion faces the mounting head 13 in the mounting position. Then, the mounting head-lifting/lowering device 52 lowers the mounting head 13 to the mounting point and the electronic part A is mounted on the circuit board B.

Figure 3:
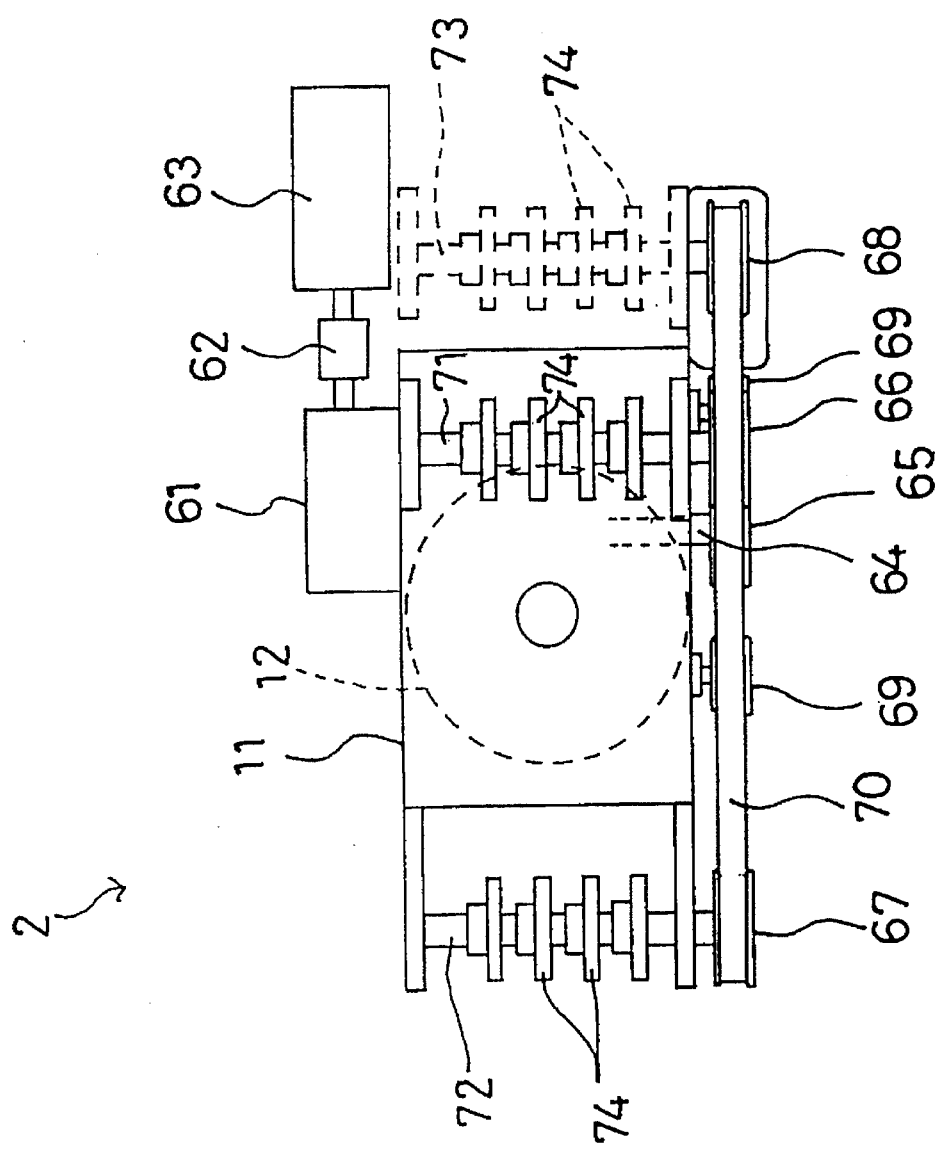
FIG. 3 is a plan view of an index unit and parts and devices associated therewith.

Next, essential parts of the present invention will be described with reference to FIGS. 3 to 5. As shown in FIG. 3 (top view) and FIG. 4 (side elevation), the worm reduction gear 61 is arranged on the input side of the index unit 11 supported by the support table 16 such that the worm reduction gear 61 is directly connected to the index unit 11. The worm reduction gear 61 is connected via a coupling 62 to a drive motor 63 as a driving force source. On the output side of the index unit 11, the rotatable table 12 is connected to the vertical shaft 41 of the index unit 11, while an output pulley 65 is rigidly mounted on the output shaft 64 of the same. On the other hand, along the periphery of the index unit 11, a top pulley 66, a side pulley 67, and a bottom pulley 68 are arranged in a manner aligned with the output pulley 65, and a pair of idle pulleys 69, 69 are similarly arranged on opposite sides of the output pulley 65, with an endless timing belt 70 being carried by these pulleys 65, 66, 67, 68, and 69 for connection therebetween.

Further, the top pulley 66, the side pulley 67, and the bottom pulley 68 are mounted on a top camshaft 71, a side camshaft 72, and a bottom camshaft 73, which extend in parallel with the output shaft 6, respectively. The camshafts 71, 72, and 73 each have a plurality of plate cams rigidly mounted thereon. The plate cams 74 are associated with respective cam followers 75 in rolling contact therewith for operating various devices including the mounting head-lifting/lowering devices 51 and 52 described above.

More specifically, the uniform rotational motion of the drive motor 63, the speed of which is reduced by the worm reduction gear 61, is input to the index unit 11, where it is converted into the intermittent rotational motion (index motion), thereby causing the rotatable table 12 to rotate intermittently via the vertical shaft 41. At the same time, the index unit 11 causes the uniform rotation of the top camshaft 71, the side camshaft 72 and the bottom camshaft 73 via the output shaft 64 and the timing belt 70 connecting the pulleys. The top camshaft 71, the side camshaft 72 and the bottom camshaft 73 transmits the driving force thereof to the associated cam followers 75 by way of the plate cams 74 rigidly mounted thereon, thereby causing each of the mounting head-lifting/lowering devices 51, 52, etc. to operate in a predetermined manner.

Figure 4:
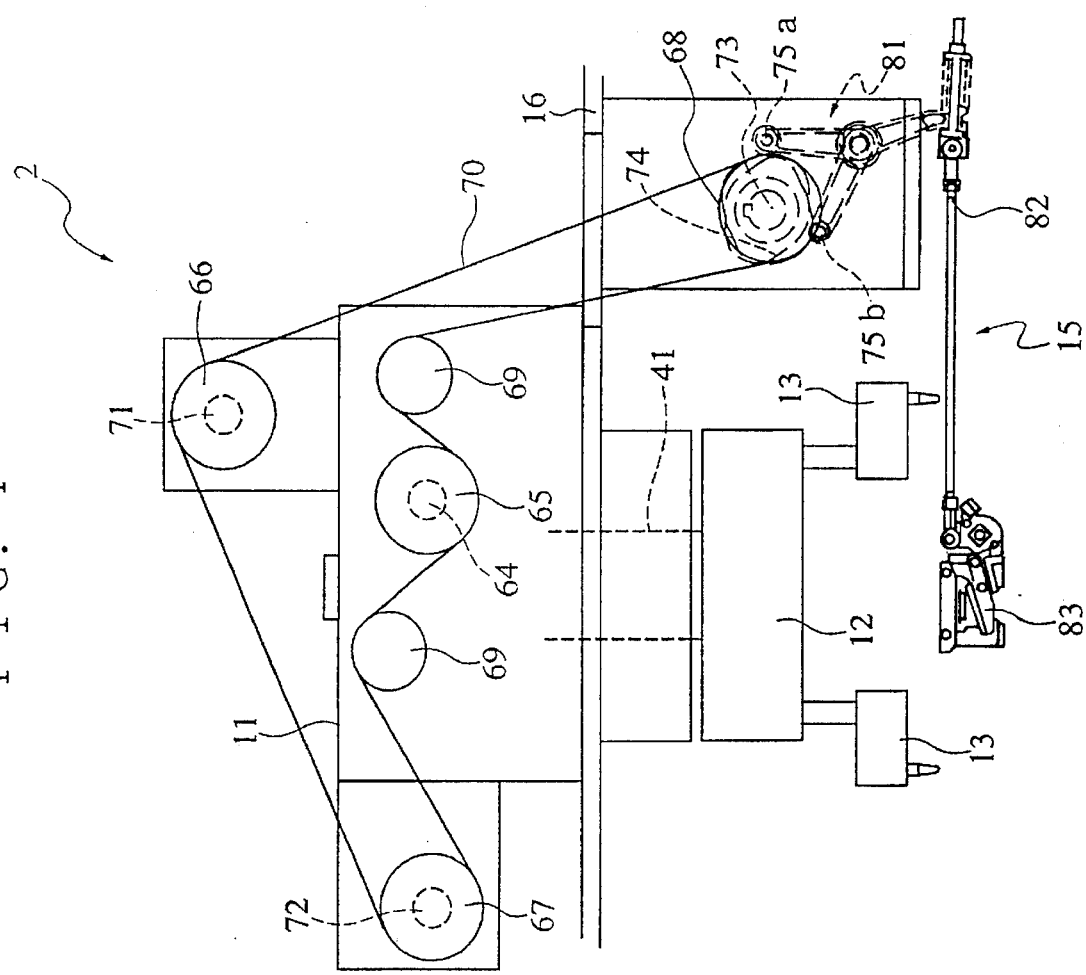
FIG. 4 is a side elevation of the index unit and parts and devices associated therewith.

As shown in FIG. 4 by way of example, the bottom camshaft 73 is connected to the tape-cutting device 15. The tape-cutting device 15 includes the plate cam 74 mounted on the bottom camshaft 73 and a pair of cam followers 75a, 75b in rolling contact therewith, which form a positive motion cam mechanism 81. A tape cutter 83 connected via a link mechanism 82 to the positive motion cam mechanism 81 is actuated into cutting operation by the operation of the positive motion cam mechanism 81.

Figure 5:
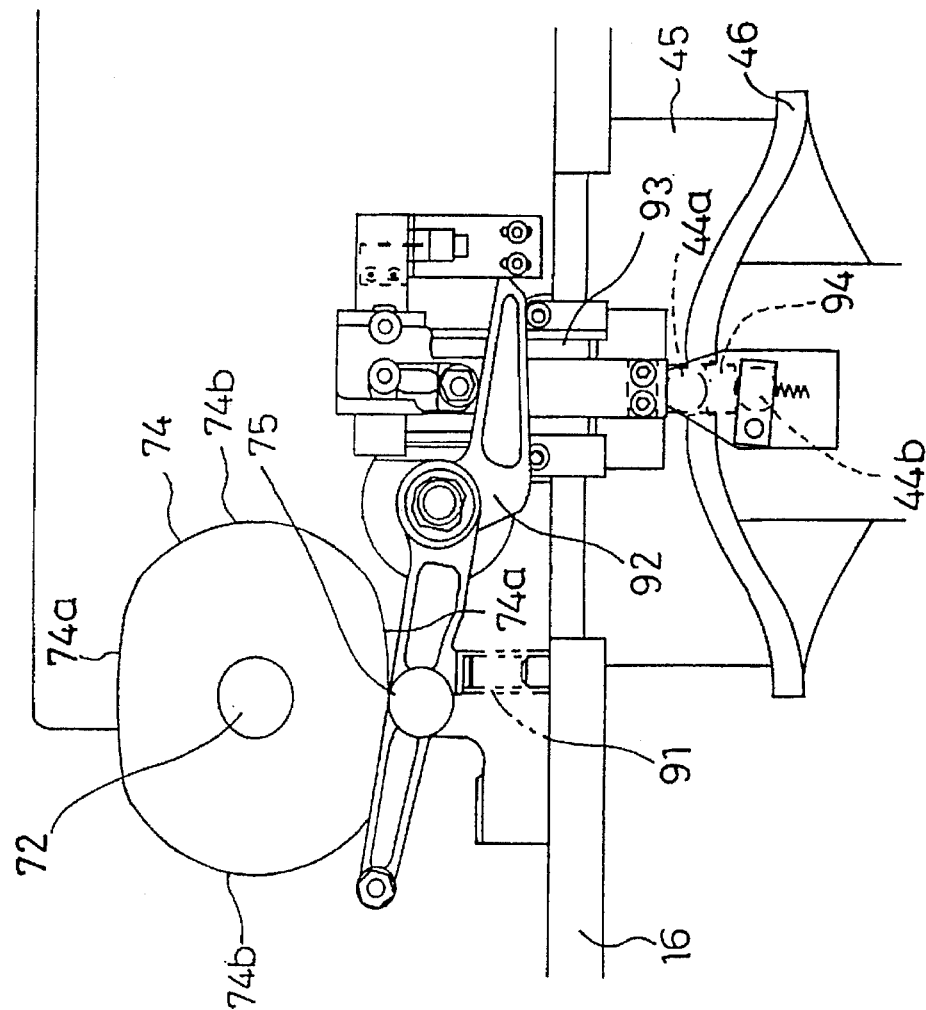
FIG. 5 is a front view of a mounting head-lifting/lowering device.

The side camshaft 72 is linked to the mounting head-lifting/lowering device 51 (52) shown in FIG. 5. In the mounting head-lifting/lowering device 51, the cam follower 75 is urged by a coiled spring 91 upward to be brought into rolling contact with the plate cam 74 mounted on the side camshaft 72, whereby a cam lever 92 supporting the cam follower 75 moves about a rotational axis thereof upward and downward to cause a bridge member 94 movably mounted on a slide unit 93 to be slid upward and downward. This causes the cam followers 44a, 44b on the mounting head 13 side which are engaged with the bridge member 94 to disconnect from the cylindrical rib cam 46 for upward and downward movement, which enables the mounting head 13 to be lowered and lifted.

As shown in the tape-cutting device 15 and the mounting head-lifting/lowering device 51, the plate cam 74 on each of the camshafts 71, 72 and 73 has a cam profile corresponding to two repetition periods of operation of the cam follower 75 which is in rolling contact the plate cam 74. For example, the plate cam 74 of the mounting head-lifting/lowering device 51 has cam surfaces 74a, 74a formed in a diametrically symmetrical manner each for lifting and lowering the mounting head 13, and cam surfaces 74b, 74b formed continuous with the cam surfaces 74a, 74a in a diametrically symmetrical manner each for holding the mounting head 13 in stoppage.

The index unit 11 according to the present embodiment is constructed such that the rotatable table 12 is driven into twelve intermittent rotations (i.e. twelve index motions) per rotation of an input shaft, not shown, of the index unit 11, and on the other hand the output shaft 64 and the camshafts 71, 72, and 73 are caused to make one rotational turn in synchronism with one rotation of the input shaft of the index unit 11 through connection therebetween by the respective pulleys 65, 66, 67, and 68 having an identical diameter. Accordingly, in the present embodiment, the plate cams 74 mounted on the camshafts 71, 72, and 73 in rolling contact with the cam followers 75 are formed with respective cam profiles each corresponding to two repetition periods of operation of the cam followers 75, whereby the repetition period of the intermittent rotation of the rotatable table 12 is made completely synchronous with the repetition period of operation of each of the devices associated therewith, such as the mounting head-lifting/lowering device 51. This makes it possible to cause the various devices arranged at the locations corresponding to the stop positions of the mounting heads 13 to operate in a reliable manner during stoppage of the rotatable table 12.

That is, even if the index unit 11 is of a fast operation type, the repetition period of intermittent rotation or operation of the rotatable table 12 can be made reliably synchronous with repetition period of operation of each device connected to the output shaft of the index unit 11, without increasing the rotation of the camshafts 71, 72 and 73, and hence that of the plate cams 74 mounted thereon. Therefore, it is possible to reduce the wear of bearings of the camshafts 71, 72 and 73, the plate cams 74, and the cam followers 75, and hence increase the speed of mounting electronic parts A without impairing the durability or life of these component parts and degrading the accuracy of dimensional sizes of the same, which would otherwise occur due to such wear.

Although in the present embodiment, plate cams are used for the various associated devices, this is not limitative, but it goes without saying that various kinds of cams can be used in place of the plate cams.

It is further understood by those skilled in the art that the foregoing is a preferred embodiment of the invention, and that various changes and modifications may be made without departing from the spirit and scope thereof.

What is claimed is:

1. An electronic parts-mounting apparatus including an index unit which has an output shaft and is connected to a reduction gear for being driven thereby, a rotatable table connected to said index unit for intermittent rotation, at least one camshaft connected to said output shaft of said index unit for uniform rotation, at least one cam rigidly mounted on said at least one camshaft, and at least one cam follower in contact with said at least one cam associated therewith, said output shaft of said index unit being caused to rotate at a uniform rotational speed in which one rotation thereof corresponds to a plurality of repetition periods of intermittent rotation of said rotatable table, the improvement wherein said at least one cam has a cam profile formed such that one rotation of said at least one cam causes a plurality of repetition periods of operation of said at least one cam follower in contact therewith, and at the same time each of said plurality of repetition periods of said operation of said at least one cam follower is identical to each of said plurality of repetition periods of said intermittent rotation of said rotatable table.

2. The electronic parts-mounting apparatus according to claim 1, wherein said output shaft and said at least one camshaft are connected to each other such that said output shaft and said at least one camshaft rotate at the same rotational speed.

3. The electronic parts-mounting apparatus according to claim 2, wherein said output shaft and said at least one camshaft are connected by a output shaft pulley rigidly mounted on said output shaft, at least one camshaft pulley rigidly mounted on said at least one camshaft, and a timing belt carried by said output shaft pulley and said at least one camshaft pulley, said output shaft pulley and said at least one camshaft pulley having an identical diameter.

4. The electronic parts-mounting apparatus according to claim 1, wherein said output shaft of said index unit rotates at said uniform rotational speed in which one rotation thereof corresponds to two repetition periods of said intermittent rotation of said rotatable table.

5. The electronic parts-mounting apparatus according to claim 2, wherein said output shaft of said index unit rotates at said uniform rotational speed in which one rotation thereof corresponds to two repetition periods of said intermittent rotation of said rotatable table.

* * * * *